(12) United States Patent
Cheng et al.

(10) Patent No.: US 9,362,182 B2
(45) Date of Patent: Jun. 7, 2016

(54) FORMING STRAINED FINS OF DIFFERENT MATERIAL ON A SUBSTRATE

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/534,678

(22) Filed: Nov. 6, 2014

(65) Prior Publication Data

US 2016/0133528 A1    May 12, 2016

(51) Int. Cl.
| | |
|---|---|
| *H01L 21/336* | (2006.01) |
| *H01L 21/84* | (2006.01) |
| *H01L 21/8234* | (2006.01) |
| *H01L 27/12* | (2006.01) |
| *H01L 27/092* | (2006.01) |

(52) U.S. Cl.
CPC ...... *H01L 21/845* (2013.01); *H01L 21/823412* (2013.01); *H01L 21/823431* (2013.01); *H01L 27/0924* (2013.01); *H01L 27/1211* (2013.01)

(58) Field of Classification Search
None
See application file for complete search history.

(56) References Cited

U.S. PATENT DOCUMENTS

| | | | |
|---|---|---|---|
| 7,198,995 B2 | 4/2007 | Chidambarrao et al. | |
| 7,304,336 B2 | 12/2007 | Cheng et al. | |
| 7,842,559 B2 | 11/2010 | Jakschik et al. | |
| 8,169,025 B2 | 5/2012 | Bedell et al. | |
| 8,183,627 B2 | 5/2012 | Currie | |
| 8,242,568 B2 | 8/2012 | Ikeda et al. | |
| 8,288,760 B2 | 10/2012 | Tezuka et al. | |
| 8,841,178 B1 | 9/2014 | Basker et al. | |
| 8,993,399 B2* | 3/2015 | Cheng | H01L 21/76224 438/268 |
| 2012/0018730 A1 | 1/2012 | Kanakasabapathy et al. | |
| 2012/0319211 A1 | 12/2012 | van Dal et al. | |
| 2014/0264595 A1* | 9/2014 | Basker | H01L 29/66795 257/347 |
| 2014/0264602 A1* | 9/2014 | Basker | H01L 29/66795 257/347 |
| 2014/0339643 A1* | 11/2014 | Cheng | H01L 21/76224 257/369 |
| 2015/0097270 A1* | 4/2015 | Bedell | H01L 27/0924 257/618 |
| 2015/0255457 A1* | 9/2015 | Loubet | H01L 27/0886 257/77 |

OTHER PUBLICATIONS

Ok et al., "Strained SiGe and Si FinFETs for High Performance Logic with SiGe/Si stack on SOI", 2010 IEEE, Sematech, GlobalFoundries, UMC, University of Florida, CNSE, University of Texas at Austin, FEI, Albany, NY, USA, pp. 34.2.1-34.2.4.

* cited by examiner

*Primary Examiner* — Zandra Smith
*Assistant Examiner* — Molly Reida
(74) *Attorney, Agent, or Firm* — Erik K. Johnson; Louis J. Percello

(57) ABSTRACT

A method, and the resulting structure, of forming two fins with different types of strain and material on the same substrate.

14 Claims, 6 Drawing Sheets

FORMING STRAINED FINS OF DIFFERENT MATERIAL ON A SUBSTRATE

BACKGROUND

The present invention relates to semiconductor devices, and particularly to forming fins of two different semiconductor materials on the same substrate.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material or property that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are often fabricated on the same substrate.

BRIEF SUMMARY

An embodiment of the invention may include a method of forming a semiconductor. A first strained fin may be formed in a first region of a semiconductor substrate, and a strained mandrel may be formed in a second region of a semiconductor substrate. The semiconductor substrate may be a strained semiconductor material and the first strained fin is made of a first strained material. The first region of the semiconductor substrate may be masked, and the strained mandrel in the second region may be relaxed to form an unstrained mandrel. A second material may be epitaxially grown on the unstrained mandrel to form a second strained fin, wherein the material of the first strained fin is different from the material of the second strained fin. The mask in the first region of the semiconductor substrate may be removed.

Another embodiment of the invention may include a method of forming a semiconductor. A first strained fin may be formed in a nFET region of a semiconductor substrate, and a strained mandrel may be formed in a pFET region of a semiconductor substrate. The semiconductor substrate may be a strained semiconductor material and the first strained fin is made of a first strained material. The nFET region of the semiconductor substrate may be masked, and the strained mandrel in the second region may be relaxed to form an unstrained mandrel. A second material may be epitaxially grown on the unstrained mandrel to form a second strained fin, wherein the material of the first strained fin is different from the material of the second strained fin. The mask in the nFET region of the semiconductor substrate may be removed.

Another embodiment of the invention may include a semiconductor structure. A first fin may be located on a substrate, and the first fin may be made of a first strained semiconductor material. A second fin may be located on the substrate, and the second fin may be made of a second strained semiconductor material.

BRIEF DESCRIPTION OF THE SEVERAL DRAWINGS

Figure 1:
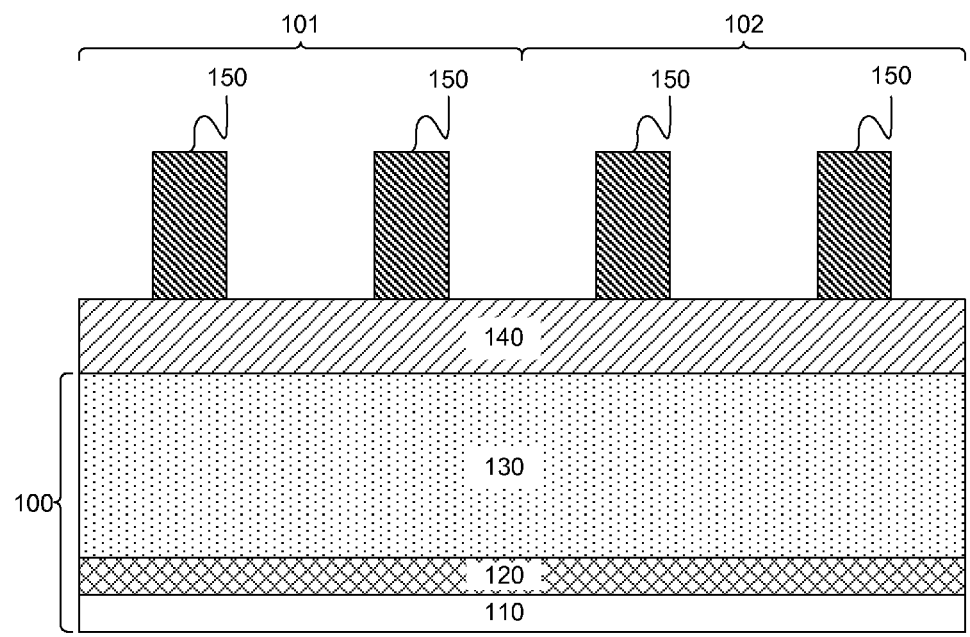
FIG. 1 is a cross-sectional view of a structure containing mandrels located on a hardmask covering a SOI substrate, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Introducing stresses or strains into semiconductor materials may increase the performance of a semiconductor device made from that material. Additionally, structures like Field Effect Transistors (FETs) may benefit from using different materials in order to create structures with different functions, such as pFETs and nFETS. Additionally, FinFET structures may allow for smaller semiconductor structures, which may increase device performance. Thus, creating at least 2 types of semiconductor fins on the same device may allow for optimization of two different structures. For example, using strained silicon for creating fins for nFETs, and strained silicon-germanium for fins in a pFET, may allow one to create better performing semiconductor devices. This may be accomplished by transferring a fin pattern into a first region and a mandrel pattern into a second region of a strained semiconductor material, like strained silicon. The first region may then be masked, and the second region may be altered to release the strain in the mandrels. A second semiconductor material may be epitaxially grown on the unstrained mandrels. This may introduce strain into the second semiconductor material if the unstrained mandrel has a significantly different crystalline structure. Once the mandrel is removed, a structure may be present where a first fin and a second fin are strained, and the first and second fin are made of different materials.

Referring now to FIG. 1, mandrels 150 may be formed above a hardmask layer 140, located on a substrate 100. The substrate 100 may include a bulk semiconductor or a layered semiconductor such as Si/SiGe, a silicon-on-insulator, or a SiGe-on-insulator, or any other semiconductor on insulator (SOI) structure. Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. If the substrate 100 is an SOI may further include a buried insulator layer 120 below the SOI layer 130, and a base semiconductor layer 110 below the buried insulator layer 120. The buried insulator layer 120 may isolate the SOI layer 130 from the base semiconductor layer 110. The base semiconductor layer 110 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. Typically the base semiconductor layer 110 may be approximately, but is not limited to, several hundred microns thick. For example, the base semiconductor layer 110 may have a thickness ranging from approximately 0.5 mm to approximately 1.5 mm. The SOI substrate 100 may contain a second region 102 and a first region 101 which may be effectively undergo different processing steps in order to form fins having different properties.

The buried insulator layer 120 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 120 may include crystalline or non-crystalline dielectric material. The buried insulator layer 120 may be 40-500 nm thick.

The SOI layer 130 may be made of any of the several semiconductor materials possible for the base semiconductor layer 110. In general, the base semiconductor layer 110 and the SOI layer 130 may include either identical or different semiconducting materials with respect to chemical composition, dopant concentration and crystallographic orientation. In an example embodiment, the SOI layer 130 comprises silicon, silicon-germanium, or carbon-doped silicon. The SOI layer 130 may be doped with p-type dopants, such as boron, or doped with n-type dopants, such as phosphorus and/or arsenic. The dopant concentration may range from approximately $1 \times 10^{15}$ cm$^{-3}$ to approximately $1 \times 10^{19}$ cm$^{-3}$, preferably approximately $1 \times 10^{15}$ cm$^{-3}$ to approximately $1 \times 10^{16}$ cm$^{-3}$. In the example embodiment, the SOI layer 130 is undoped. The SOI layer 130 may have a thickness ranging from approximately 5 nm to approximately 300 nm, preferably approximately 30 nm.

A SOI substrate 100 is illustrated in the figures and is relied upon for the corresponding discussion. In the example embodiment, the SOI layer may be a strained silicon or strained silicon-germanium material. The hardmask layer 140 may include multiple layers. In one embodiment, the hardmask layer 140 may include silicon oxide, silicon nitride, a metal-nitride, such as titanium-nitride (TiN), boron-nitride (BN), or a metal-oxide, or any combination thereof. Further, in some embodiments, the hardmask layer 140 may have a thickness, ranging from about 5 nm to about 80 nm.

The mandrel 150 may be generated using known photolithography and masking techniques. During this step, a mandrel layer may be formed on top of the hardmask layer 140. The mandrel layer may include amorphous silicon or any silicon based compound, for example, silicon nitride, silicon oxide, or silicon carbon, or alternatively amorphous carbon. The mandrel layer may preferably include a material that is different enough from the material of the sidewall spacers 170 (described below) and the material of the hardmask layer 140 so that it may be selectively removed. The particular material chosen may partly depend upon the desired pattern to be formed and the materials chosen in subsequent steps discussed below. In one embodiment, the mandrel layer may be formed with a vertical thickness ranging from about 30 nm to about 150 nm. The mandrel layer may then be lithographically patterned to create the mandrel 150. The mandrel 150 may be formed by applying known patterning techniques involving exposing a photo-resist and transferring the exposed pattern of the photo-resist by etching the mandrel layer.

Figure 2:
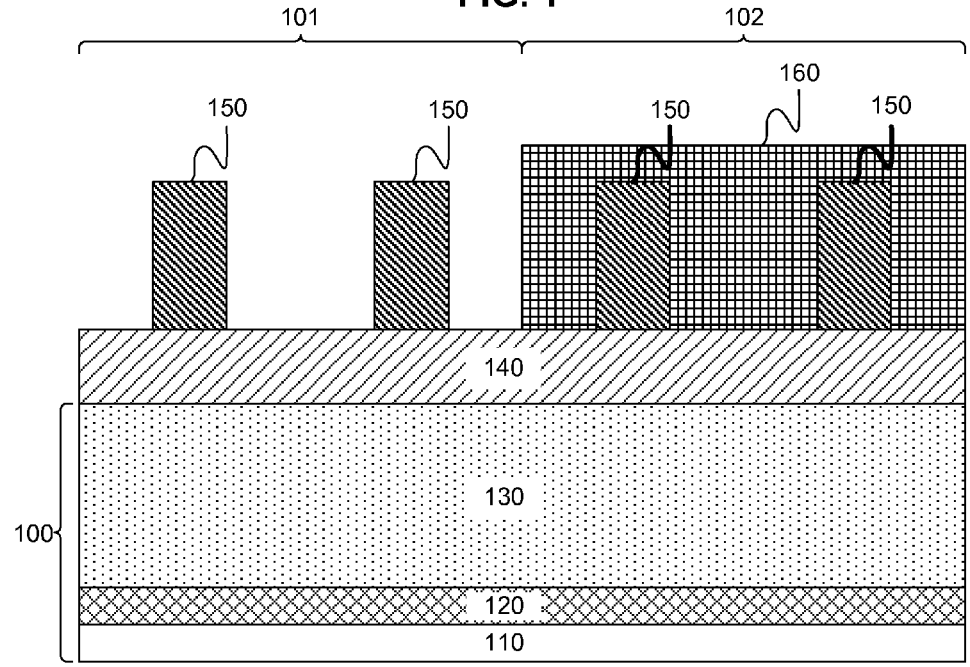
FIG. 2 is a cross-sectional view of masking a second region of the structure, according to an example embodiment.

Referring now to FIG. 2, in the example embodiment the mandrels 150 of the second region 102 may be protected with a first masking structure 160. The first masking structure 160 may be used to eliminate deposition on the mandrel 150 in the second region 102, while allowing deposition on the mandrel 150 in the first region 101. This may allow the subsequent formation of a fin pattern in the first region 101, and maintain the mandrel 150 pattern in the second region 102. More specifically, the method may include masking the second region 102 of the semiconductor by forming a masking layer, patterning at least the second region 102, and etching the masking layer from the unprotected regions. The masking layer may include an oxide (e.g. silicon oxide), a nitride (e.g. silicon nitride) or any combinations thereof. Patterning of the desired region may be done through lithographic techniques. Etching the masking layer may be accomplished through any combination of known techniques, such as, for example, RIE, wet stripping and plasma etching.

Figure 3:
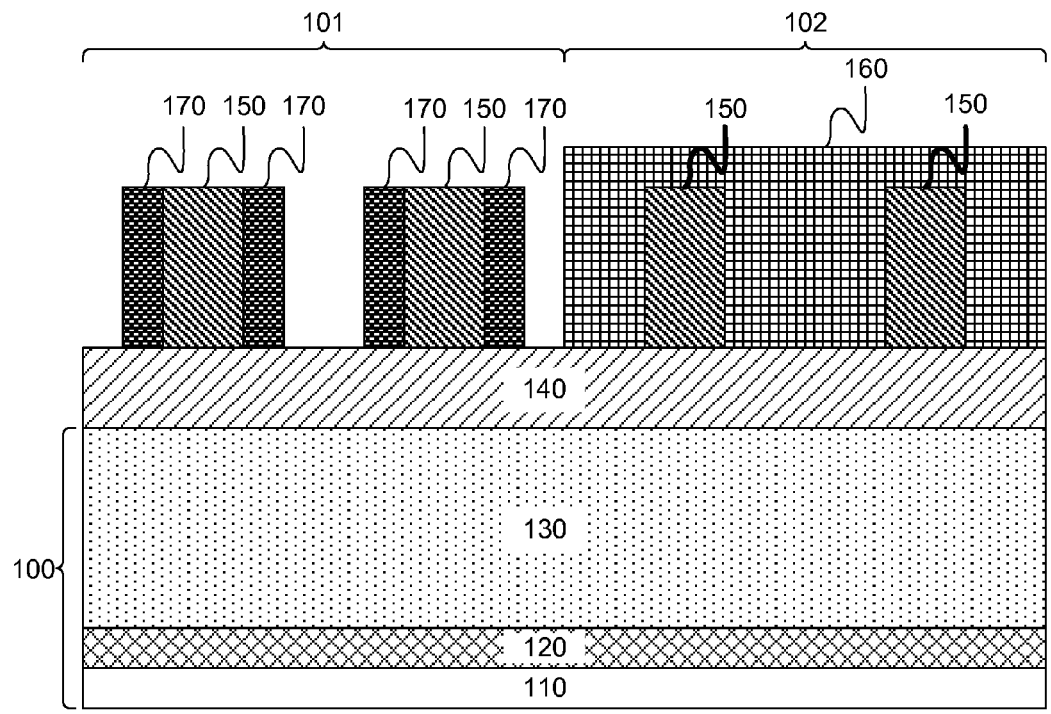
FIG. 3 is a cross-sectional view of formation of sidewall spacers next to the exposed mandrels, according to an example embodiment.

Referring now to FIG. 3, in the example embodiment sidewall spacers 170 may be formed adjacent to the mandrel 150 by conformally depositing a layer of dielectric material (hereinafter "dielectric layer") directly on top of the hardmask layer 140 and the mandrel 150. In one embodiment, the dielectric layer may include, for example, silicon nitride or silicon oxide. It should be noted, however, that the dielectric layer should be of a material capable of being removed selective to the hardmask layer 140. For example, if the hardmask layer 140 is an oxide then the dielectric layer may preferably be a nitride, or alternatively, if the hardmask layer 140 is a nitride then the dielectric layer may preferably be an oxide. The dielectric layer may be deposited with a conformal deposition technique, using any known atomic layer deposition technique, molecular layer deposition techniques, or future developed deposition technique. In an embodiment, the dielectric layer may have a substantially uniform thickness. In that embodiment, the dielectric layer may have a conformal and uniform thickness ranging from about 5 nm to about 50 nm.

Following deposition of the dielectric material, sidewall spacers 170 may be formed by subjecting the dielectric layer to a directional etching process such as a reactive-ion-etching technique. The directional etching process may remove a portion of the dielectric layer from above the hardmask layer 140 and from the top of the mandrel 150. A portion of the dielectric layer may remain along opposite sidewalls of the mandrel 150, forming the sidewall spacers 170. Furthermore, the mandrel 150 and the sidewall spacers 170 should each include materials that would allow the mandrel 150 to be subsequently removed selective to the sidewall spacers 170. Here, it should also be noted that the sidewall spacers 170 depicted in FIGS. 3 and 3A are for illustration purposes and generally may have a slightly different shape from those shown. For example, the sidewall spacers 170 may have rounded corners that may be naturally formed during the directional etching process as is known in the art. The sidewall spacers 170 will eventually define a fin pattern which ultimately may be transferred into the underlying substrate 100.

Figure 4:
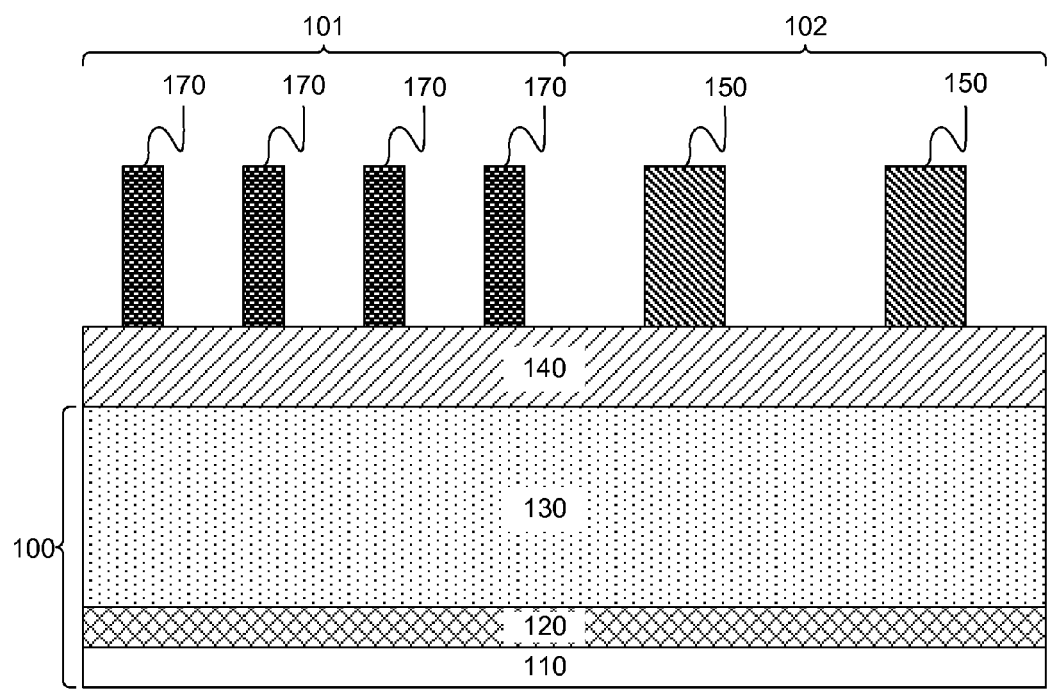
FIG. 4 is a cross-sectional view of removing the mandrels from the first region and the mask from the second region of the structure, according to an example embodiment.

Referring now to FIG. 4, in the example embodiment the mandrels 150 in the first region 101 and the first masking structure 160 in the second region 102 may be removed. This may create the final structures to be transferred to the underlying semiconductor material. First, the mandrel 150 may be removed selective to the sidewall spacers 170. A non-selective breakthrough etch may be applied to exposed the mandrel 150. In one embodiment, the mandrel 150 is silicon, and the sidewall spacers 170 is an oxide. In such cases, the silicon may be removed selective to the oxide. Furthermore, the mandrel 150 may be removed selective to the hardmask layer 140. In one embodiment, the mandrel 150 may be removed using a typical standard clean technique, including ammonium hydroxide and hydrogen peroxide, in which the sidewall spacers 170 will not be trimmed. Removing the first masking structure 160 may be accomplished by any suitable means, such as RIE, plasma etching and wetstripping the first masking structure 160.

Figure 5:
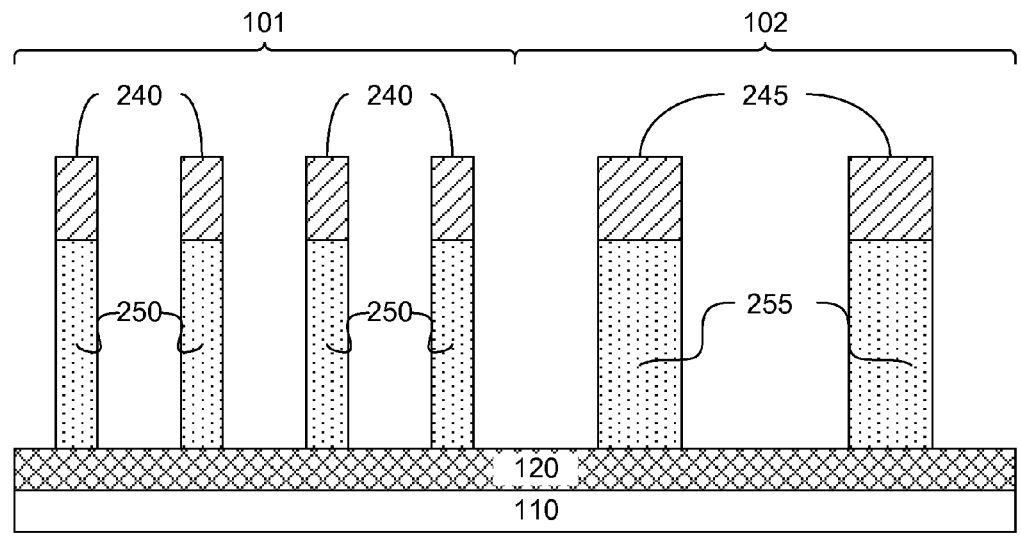
FIG. 5 is a cross-sectional view after etching the fin and mandrel pattern to the underlying semiconductor, according to an example embodiment.

Referring now to FIG. 5, in the example embodiment the pattern is transferred to the underlying semiconductor material. More specifically, a fin pattern defined by the sidewall spacers 170 may be transferred into the substrate 100 using a multi-sequence etching technique. First, the hardmask layer 140 may be etched to expose the substrate 100. A directional etching technique such as a reactive-ion-etching technique may be used to etch the exposed hardmask layer 140, to create a fin hardmask 240 and a mandrel hardmask 245. In one embodiment, where the hardmask layer 140 is an oxide, a reactive-ion-etching technique using a fluorocarbon based etchant with additional gases such as $O_2$ or Ar may be used. In the present step, the sidewall spacers 170 and mandrel 150 may function as a mask, and may have high etch selectivity relative to the hardmask layer 140.

Next, the semiconductor layer 130 of the substrate 100 may then be etched to a desired depth. The desired depth may depend on the ultimate function of the structure 10. A directional etching technique such as a reactive-ion-etching technique, such as described above, may be used to etch the substrate 100. In one embodiment, the substrate 100 may be etched with a reactive-ion-etching technique using a chlorine or a bromine based etchant. In the present step, the hardmask layer 140 may function as a mask, and may have a high etch-selectivity relative to the substrate 100. In an embodiment, the semiconductor layer 130 may be etched all the way down to the oxide layer 120. Following the etch, at least a first fin 250 and a set of semiconductor mandrels 255, are formed. Following the etch, the fin hardmask 240 is located above each first fin 250, and the mandrel hardmask 245 is located above each semiconductor mandrel 255.

Figure 6:
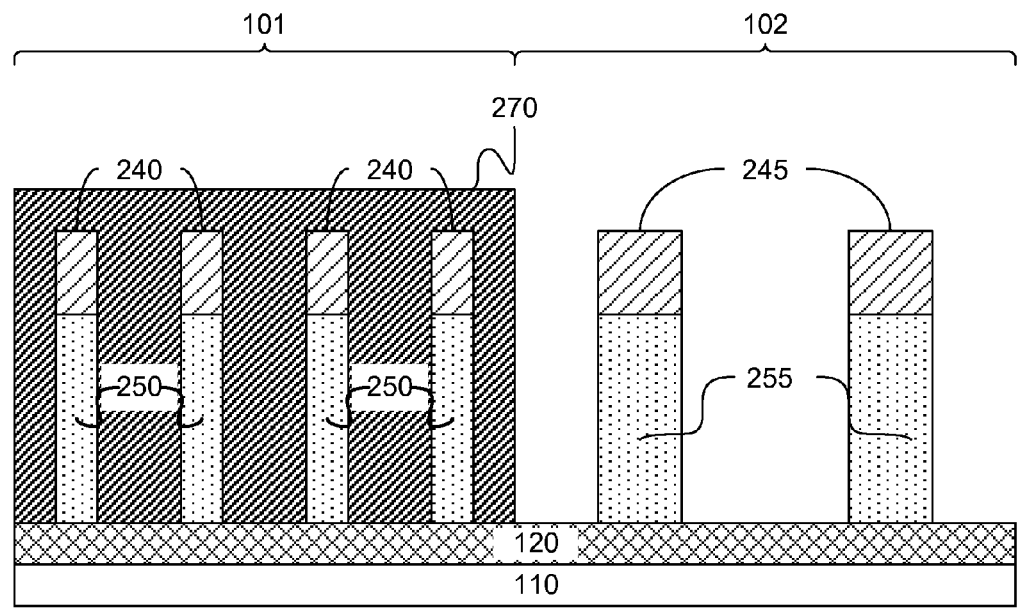
FIG. 6 is a cross-sectional view of masking the first region of the structure, according to an example embodiment.

Referring now to FIG. 6, in the example embodiment the first region 101 is covered with a second masking structure 270. The second masking structure 270 ensures that the strained fins will maintain the strain during subsequent processing. More specifically, the method may include masking a region of the semiconductor by forming a masking layer, patterning the desired region, and etching the masking layer from the unprotected regions. The masking layer may include an oxide (e.g. silicon oxide), a nitride (e.g. silicon nitride) or any combinations thereof. Patterning of the desired region may be done through lithographic techniques, to the desired structure. Etching the second masking structure 270 may be accomplished through any combination of known techniques, such as, for example, RIE, wet stripping and plasma etching.

Figure 7:
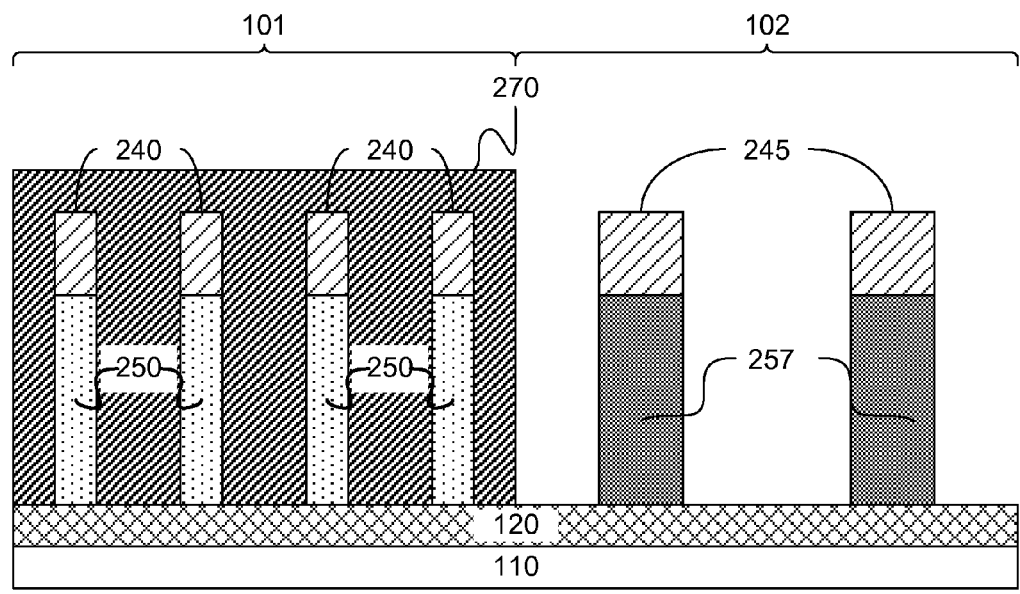
FIG. 7 is a cross-sectional view after relaxing the mandrels in the second region of the semiconductor structure, according to an example embodiment.

Referring now to FIG. 7, in the example embodiment the mandrels 255 (FIG. 6) in the second region 102 may be relaxed to form relaxed mandrels 257. Relaxing the mandrels 255 in the second region 102 may change the crystal lattice of the material. This may allow for a different semiconductor material to be epitaxially grown on the sidewalls of the relaxed mandrels, to impart the crystal lattice of a relaxed material from the SOI layer 130 (FIG. 4). In instances where the crystal lattices of the relaxed semiconductor material of the SOI layer 130, and the epitaxially grown semiconductor material, are sufficiently different, this may impart stresses or strains into the epitaxially grown semiconductor. Relaxing the strained semiconductor material may be accomplished through any known means, such as a thermal anneal, ion implantation combined with recrystallization method or any other means of chemical addition. In an example embodiment, where the semiconductor material is strained silicon, the strain may be released using a thermal anneal in the presence of hydrogen.

Figure 8:
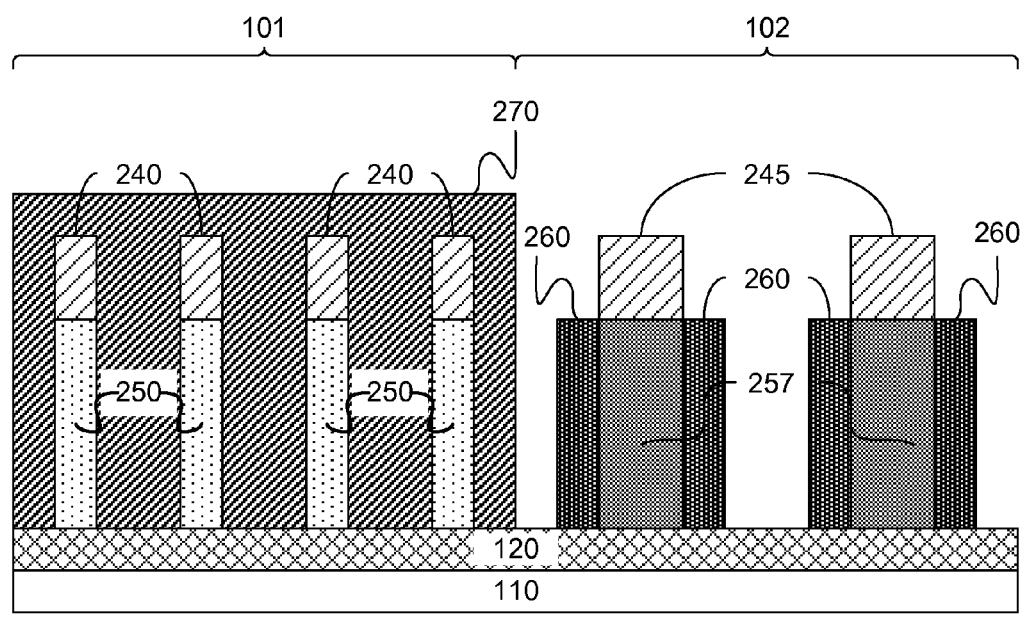
FIG. 8 is a cross-sectional view of fins epitaxially grown on the relaxed mandrels in the second region, according to an example embodiment.

Referring now to FIG. 8, in the example embodiment at least a second fin 260 of a semiconductor material of a material different from that in the SOI layer 130 may be epitaxially grown on the sidewalls of the relaxed mandrel 257 in the second region 102. The semiconductor material may be any semiconductor material, such as the semiconductor materials listed above. In an example embodiment, the semiconductor material may be silicon-germanium. In such embodiments, the silicon germanium material may contain, for example, approximately 20% to approximately 100% germanium, approximately 0% to approximately 80% silicon, and may be doped with p-type dopants such as boron in concentrations ranging from approximately $1 \times 10^{15}$ atoms/cm$^3$ to approximately $5 \times 10^{18}$ atoms/cm$^3$. In other example embodiments, the semiconductor material 170 may be carbon doped silicon. In such embodiment, the silicon germanium material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{15}$ atoms/cm$^3$ to approximately $5 \times 10^{18}$ atoms/cm$^3$. In an example embodiment, semiconductor mandrel 255 may be silicon, and the semiconductor material may be silicon-germanium. In such an embodiment, epitaxially growing silicon-germanium on silicon may impart stress into the silicon-germanium crystal lattice.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces. In embodiments where the semiconductor material has a different lattice constant from the deposition surface, the semiconductor material may take on the lattice structure of the deposition surface, which may impart stresses or strains into the epitaxially grown semiconductor material.

Figure 9:
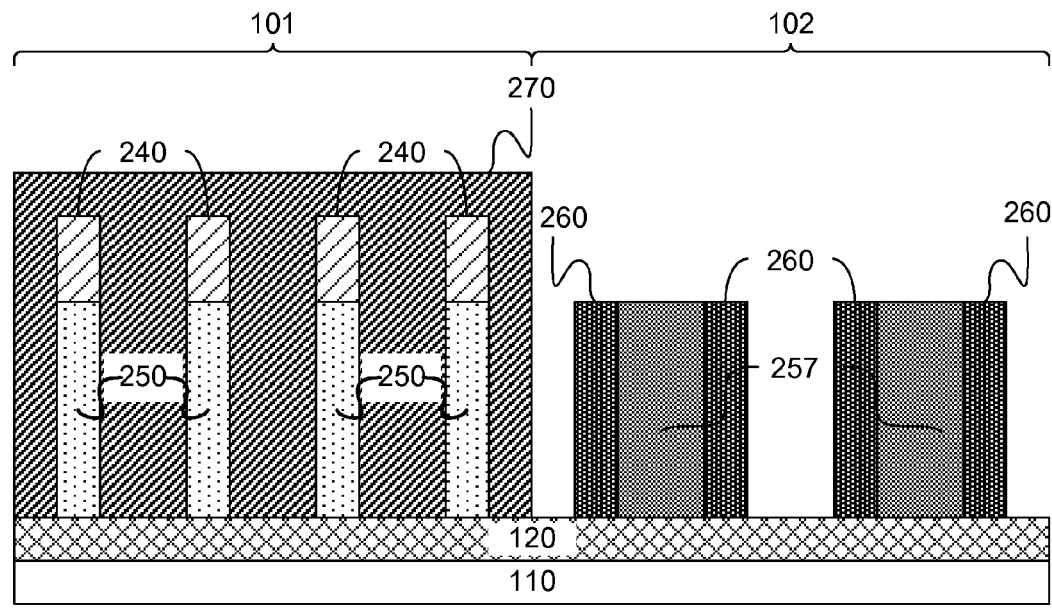
FIG. 9 is a cross-sectional view of removing the hardmask above the relaxed mandrels, according to an example embodiment.

Referring now to FIG. 9, in the example embodiment the mandrel hardmask 245 is removed from above the semiconductor mandrel 150 in the second region 102. Removing the mandrel hardmask 245 may be accomplished by any suitable means, such as RIE, plasma etching and wetstripping.

Figure 10:
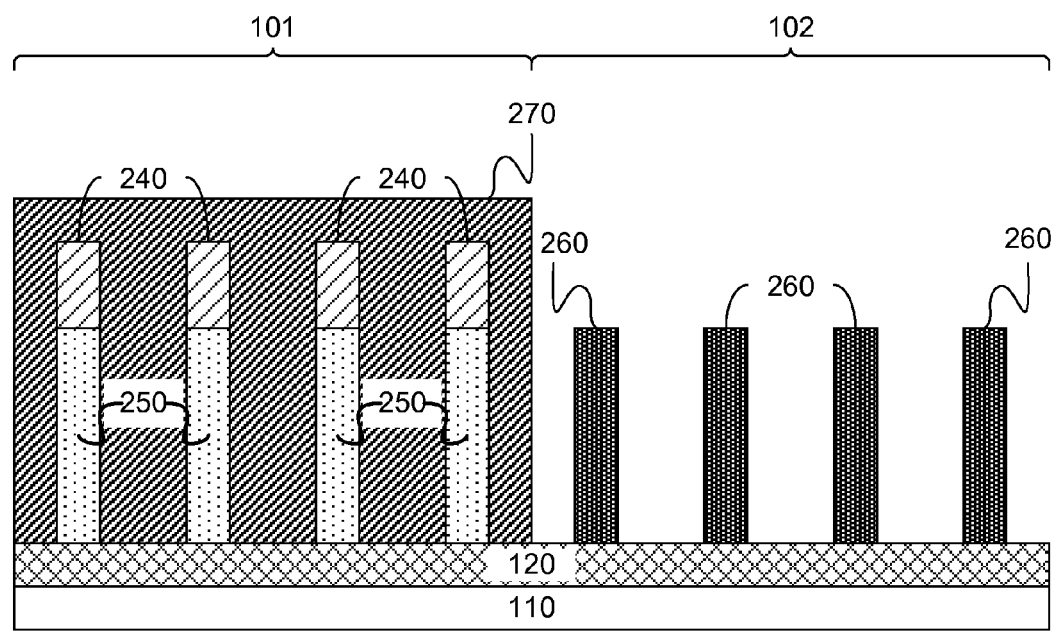
FIG. 10 is a cross-sectional view of removing the relaxed mandrels, according to an example embodiment.

Referring now to FIG. 10, in the example embodiment the semiconductor mandrel 255 is removed from the second region 102. More specifically, the semiconductor mandrel 255 may be removed selective to the second fins 260. This may be performed using any means capable of selectively removing the semiconductor material such as, for example, TMAH solution can be used to etch Si selective to SiGe.

Figure 11:
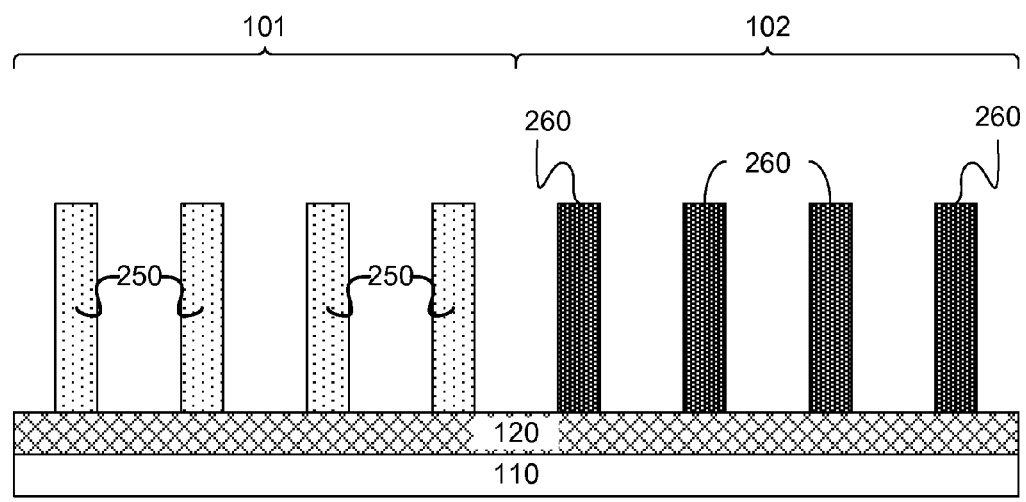
FIG. 11 is a cross-sectional view of the formed fins, according to an example embodiment.

Referring now to FIG. 11, in the example embodiment the second masking structure 270 and the fin hardmask 240 may be removed from the first region 101. Removing the second masking structure 270 and the fin hardmask may be accomplished by any suitable means, such as RIE, plasma etching and wetstripping.

Following the removal of the second masking structure 270 and the fin hardmask 245, a first semiconductor fin 250 and a second semiconductor fin 260 may be located on the same device. The material for the first fin 250 and the second semiconductor fin 260 may be selected that there is a lattice mismatch between the materials, such that when the material of the second semiconductor fin 260 is epitaxially grown on the material of the first fin 250, a strain is introduced into the crystal lattice of the first material. In an example embodiment, the first material may be silicon and the second material may be silicon-germanium. In the example embodiment, a fin pattern in a first region 101 and a mandrel pattern in a second region 102 may be introduced into a strained silicon-on-insulator substrate. The mandrels in the second region may be relaxed prior to epitaxial growth of silicon-germanium to create the second semiconductor fins 260, which may be strained due to the lattice mismatch between silicon and silicon-germanium. This may create a silicon fin with tensile strain on the same device as a silicon germanium fin with compressive strain. This may allow for increased performance of devices made from these fins, such as nFETs and pFETs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor comprising:
   forming a first strained fin in a first region of a semiconductor substrate, and a strained mandrel in a second region of a semiconductor substrate, wherein the semiconductor substrate is a strained semiconductor material and the first strained fin is made of a first strained material;
   masking the first region of the semiconductor substrate;
   relaxing the strained mandrel in the second region to form an unstrained mandrel;
   epitaxially growing at least a fin on the unstrained mandrel to form a second strained fin, wherein the material of the first strained fin is different from the material of the second strained fin;
   removing the mask in the first region of the semiconductor substrate.

2. The method of claim 1, wherein the first strained material is strained silicon.

3. The method of claim 1, wherein the second strained material is strained silicon germanium.

4. The method of claim 1, wherein relaxing the mandrel comprises changing the crystal lattice of the structure.

5. The method of claim 4, wherein relaxing the mandrel comprises a hydrogen anneal.

6. The method of claim 1, wherein the first strained material has a tensile strain.

7. The method of claim 1, wherein the second strained material has a compressive strain.

8. The method of claim 1, wherein the substrate is a strained semiconductor on insulator.

9. A method of forming a semiconductor comprising:
   forming a first strained fin in a nFET region of a semiconductor substrate, and a strained mandrel in a pFET region of a semiconductor substrate, wherein the semiconductor substrate is a strained semiconductor material and the first strained fin is made of a first strained material;

masking the nFET region of the semiconductor substrate;

relaxing the strained mandrel in the pFET region to form an unstrained mandrel;

epitaxially growing at least a fin on the unstrained mandrel to form a second strained fin, wherein the material of the second strained fin is silicon-germanium;

removing the mask in the first region of the semiconductor substrate.

10. The method of claim 9, wherein relaxing the mandrel comprises changing the crystal lattice of the structure.

11. The method of claim 10, wherein relaxing the mandrel comprises a hydrogen anneal.

12. The method of claim 9, wherein the strained silicon has a tensile strain.

13. The method of claim 9, wherein the strained silicon-germanium has a compressive strain.

14. The method of claim 9, wherein the substrate is a strained semiconductor on insulator.

* * * * *